United States Patent
Shim et al.

(10) Patent No.: US 9,825,190 B2
(45) Date of Patent: Nov. 21, 2017

(54) SOLAR CELL AND METHOD FOR MANUFACTURING THE SAME

(75) Inventors: Seunghwan Shim, Seoul (KR); Sangwook Park, Seoul (KR)

(73) Assignee: LG ELECTRONICS INC., Seoul (KR)

(*) Notice: Subject to any disclaimer, the term of this patent is extended or adjusted under 35 U.S.C. 154(b) by 720 days.

(21) Appl. No.: 13/526,970

(22) Filed: Jun. 19, 2012

(65) Prior Publication Data

US 2012/0318349 A1  Dec. 20, 2012

(30) Foreign Application Priority Data

Jun. 20, 2011  (KR) .................. 10-2011-0059663

(51) Int. Cl.
| | |
|---|---|
| *H01L 31/0216* | (2014.01) |
| *H01L 31/0224* | (2006.01) |
| *H01L 31/068* | (2012.01) |
| *H01L 31/18* | (2006.01) |
| *H01L 31/056* | (2014.01) |

(52) U.S. Cl.
CPC ............... *H01L 31/02167* (2013.01); *H01L 31/022425* (2013.01); *H01L 31/056* (2014.12); *H01L 31/068* (2013.01); *H01L 31/1804* (2013.01); *Y02E 10/52* (2013.01); *Y02E 10/547* (2013.01); *Y02P 70/521* (2015.11)

(58) Field of Classification Search
CPC ......... H01L 31/02167; H01L 31/02168; H01L 31/02245; H01L 31/022458
See application file for complete search history.

(56) References Cited

U.S. PATENT DOCUMENTS

| | | | |
|---|---|---|---|
| 4,691,077 A * | 9/1987 | Gregory et al. | ............... 136/256 |
| 5,903,047 A * | 5/1999 | Liao et al. | ..................... 257/632 |
| 2006/0130891 A1* | 6/2006 | Carlson | ............. H01L 31/02168 |
| | | | 136/256 |
| 2007/0137692 A1 | 6/2007 | Carlson | |

(Continued)

FOREIGN PATENT DOCUMENTS

| | | |
|---|---|---|
| DE | 102006046726 A1 | 4/2008 |
| KR | 10-2003-0079265 A | 10/2003 |
| KR | 10-2010-0096746 A | 9/2010 |

OTHER PUBLICATIONS

Polyanskiy "Refractive index database," http://refractiveindex.info (accessed Jun. 18, 2016).*

(Continued)

*Primary Examiner* — Magali P Slawski
(74) *Attorney, Agent, or Firm* — Birch, Stewart, Kolasch & Birch, LLP

(57) ABSTRACT

A solar cell and a method for manufacturing the same are discussed. The solar cell includes a substrate of a first conductive type, an emitter region of a second conductive type opposite the first conductive type, the emitter region forming a p-n junction along with the substrate, a passivation layer which is positioned on a back surface of the substrate and has a plurality of via holes exposing portions of the back surface of the substrate, a first electrode connected to the emitter region, and a second electrode which is positioned on a back surface of the passivation layer and is connected to the substrate through the plurality of via holes.

19 Claims, 9 Drawing Sheets

(56) References Cited

U.S. PATENT DOCUMENTS

| | | | |
|---|---|---|---|
| 2008/0210294 A1* | 9/2008 | Moslehi | H01L 31/042 |
| | | | 136/251 |
| 2009/0223560 A1* | 9/2009 | Kim | H01L 31/02168 |
| | | | 136/256 |
| 2009/0260685 A1* | 10/2009 | Lee et al. | 136/256 |
| 2009/0283141 A1* | 11/2009 | Bentzen | H01L 31/02167 |
| | | | 136/256 |
| 2009/0283143 A1 | 11/2009 | Krause et al. | |
| 2009/0317934 A1 | 12/2009 | Scherff et al. | |
| 2010/0084009 A1 | 4/2010 | Carlson et al. | |
| 2010/0126579 A1* | 5/2010 | Fang | H01L 31/075 |
| | | | 136/256 |
| 2010/0258177 A1* | 10/2010 | Ko | H01L 31/02168 |
| | | | 136/256 |

OTHER PUBLICATIONS

Machorro et al. "Modification of refractive index in silicon oxynitride films during deposition" in Materials Letters, vol. 45, Issue 1, Aug. 2000, pp. 47-50.*

Vlasukova et al. "Optical properties of silicon nitride films formed by plasma-chemical vapor deposition" Journal of Applied Spectroscopy, vol. 80, No. 1, Mar. 2013 (Russian Original vol. 80, No. 1, Jan.-Feb. 2013).*

Focsa et al. , "Surface passivation at low temperature of p- and n-type silicon wafers using a double layer a-Si:H/SiNx:H", Materials Science and Engineering B, vol. 159-160 Mar. 15, 2009, pp. 242-247

Mader et al. "Rear-side point-contacts by inline thermal evaporation of aluminum" IEEE, Jun. 2010, pp. 001446-001449.

* cited by examiner

SOLAR CELL AND METHOD FOR MANUFACTURING THE SAME

This application claims priority to and the benefit of Korean Patent Application No. 10-2011-0059663 filed in the Korean Intellectual Property Office on Jun. 20, 2011, the entire contents of which are incorporated herein by reference.

BACKGROUND OF THE INVENTION

Field of the Invention

Embodiments of the invention relate to a solar cell and a method for manufacturing the same.

Description of the Related Art

A solar cell generally includes a substrate and an emitter region, each of which is formed of a semiconductor, and electrodes respectively connected to the substrate and the emitter region. The semiconductors forming the substrate and the emitter region have different conductive types, for example, a p-type and an n-type. A p-n junction is formed at an interface between the substrate and the emitter region.

When light is incident on the solar cell, a plurality of electron-hole pairs are produced in the semiconductors. The electron-hole pairs are separated into electrons and holes by the photovoltaic effect. The separated electrons move to the n-type semiconductor (e.g., the emitter region), and the separated holes move to the p-type semiconductor (e.g., the substrate). Then, the electrons and holes are collected by the electrodes electrically connected to the emitter region and the substrate, respectively. The electrodes are connected to each other using electric wires to thereby obtain electric power.

SUMMARY OF THE INVENTION

In one aspect, there is a solar cell including a substrate of a first conductive type, an emitter region of a second conductive type opposite the first conductive type, the emitter region forming a p-n junction along with the substrate, a passivation layer positioned on a back surface of the substrate, the passivation layer having a plurality of via holes exposing portions of the back surface of the substrate, a first electrode connected to the emitter region, and a second electrode which is positioned on a back surface of the passivation layer and is connected to the substrate through the plurality of via holes, wherein the passivation layer includes a first passivation layer, which is positioned on the back surface of the substrate and is formed of amorphous silicon, and a second passivation layer, which is positioned on a back surface of the first passivation layer and is formed of amorphous silicon nitride.

The passivation layer may further include a third passivation layer which is positioned between the back surface of the substrate and the first passivation layer and is formed of silicon oxide.

A refractive index of the first passivation layer may be more than a refractive index of the second passivation layer and the third passivation layer, respectively.

In more detail, the first passivation layer may have a thickness of about 50 nm to 100 nm and a refractive index of about 3.0 to 3.8, and the second passivation layer may have a thickness of about 10 nm to 50 nm and a refractive index of about 1.8 to 1.9.

The third passivation layer may have a thickness of about 50 nm to 200 nm and a refractive index of about 1.3 to 1.7.

A ratio of a refractive index of the first passivation layer to a refractive index of the second passivation layer may be about 1.57 to 2.11.

A thickness of the substrate may be about 60 μm to 140 μm.

The solar cell may further include an anti-reflection layer on the emitter region.

The solar cell may further include a back surface field region positioned at portions of the substrate contacting the second electrode.

In another aspect, there is a method for manufacturing a solar cell including forming an emitter region of a second conductive type opposite a first conductive type at a substrate of the first conductive type, forming a passivation layer of a multi-layered structure having a plurality of via holes on a back surface of the substrate, and forming a first electrode connected to the emitter region and a second electrode connected to the substrate through the plurality of via holes of the passivation layer, wherein the forming of the passivation layer includes forming a first passivation layer formed of amorphous silicon on the back surface of the substrate, and forming a second passivation layer formed of amorphous silicon nitride on a back surface of the first passivation layer.

The forming of the passivation layer may further include forming a third passivation layer formed of silicon oxide on the back surface of the substrate before forming the first passivation layer.

The first passivation layer may have a thickness of about 50 nm to 100 nm.

The second passivation layer may have a thickness of about 10 nm to 50 nm.

The third passivation layer may have a thickness of about 50 nm to 200 nm.

A ratio of a refractive index of the first passivation layer to a refractive index of the second passivation layer may be about 1.57 to 2.11.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
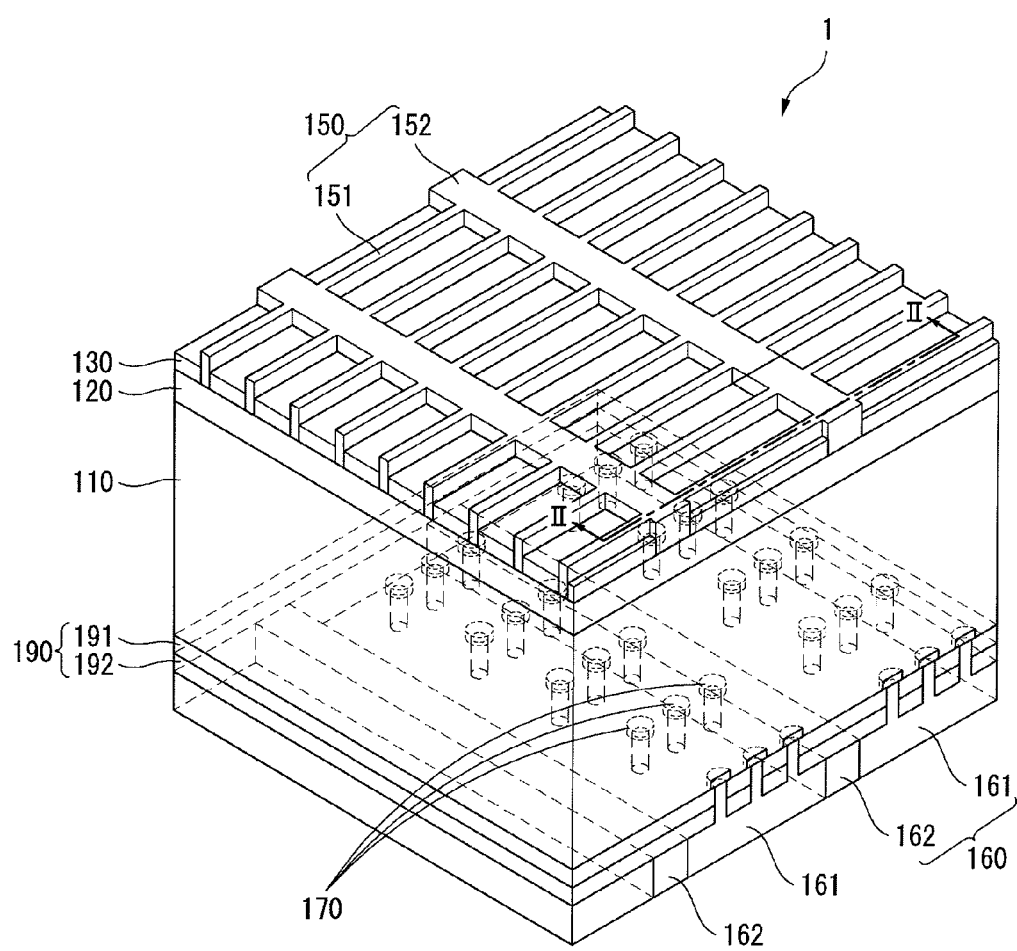
FIG. 1 is a partial perspective view of a solar cell according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It should be understood that a detailed description of known arts will be omitted if it is determined that the known arts can lead to obscuring of the embodiments of the invention.

In the drawings, the thickness of layers, films, panels, regions, etc., are exaggerated for clarity. It should be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may be not on a portion of an edge of the other element.

Figure 2:
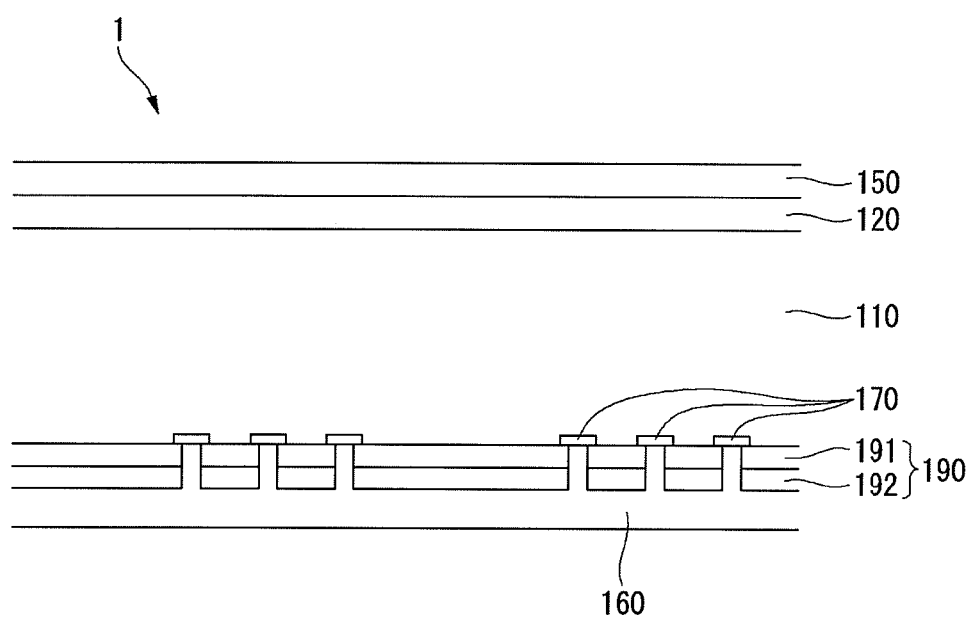
FIG. 2 is a cross-sectional view taken along line II-II of FIG. 1.

A solar cell and a method for manufacturing the same according to example embodiments of the invention will be described in detail with reference to FIGS. 1 to 9. First, a solar cell according to an example embodiment of the invention is described with reference to FIGS. 1 and 2. FIG. 1 is a partial perspective view of a solar cell according to an example embodiment of the invention, and FIG. 2 is a cross-sectional view taken along line II-II of FIG. 1.

As shown in FIG. 1, a solar cell 1 according to an example embodiment of the invention includes a substrate 110, an emitter region 120 positioned at an incident surface (hereinafter, referred to as "a front surface") of the substrate 110 on which light is incident, an anti-reflection layer 130 positioned on the emitter region 120, a passivation layer 190 of a multi-layered structure which is positioned on a surface (hereinafter, referred to as "a back surface") opposite the front surface of the substrate 110 and has a plurality of via holes exposing a portion of the substrate 110, a plurality of front electrodes 151 electrically connected to the emitter region 120, a plurality of front electrode current collectors 152 which are connected to the plurality of front electrodes 151 and extend in a direction crossing the plurality of front electrodes 151, a back electrode 161 which is positioned on a back surface of the passivation layer 190 and is electrically connected to the substrate 110 through the via holes of the passivation layer 190, a plurality of back electrode current collectors 162 which are positioned on the passivation layer 190 and are electrically connected to the back electrode 161, and a plurality of back surface field (BSF) regions 170 which are positioned between the portion of the substrate 110 exposed through the via holes of the passivation layer 190 and the back electrode 161.

The plurality of front electrodes 151 and the plurality of front electrode current collectors 152 are included in a first electrode 150. Further, the back electrode 161 and the plurality of back electrode current collectors 162 are included in a second electrode 160.

The substrate 110 is a semiconductor substrate formed of first conductive type silicon, for example, p-type silicon, though not required. Silicon used in the substrate 110 may be single crystal silicon, polycrystalline silicon, or amorphous silicon. When the substrate 110 is of the p-type, the substrate 110 contains impurities of a group III element such as boron (B), gallium (Ga), and/or indium (In). Alternatively, the substrate 110 may be of an n-type and/or may be formed of a semiconductor material other than silicon. If the substrate 110 is of the n-type, the substrate 110 may contain impurities of a group V element such as phosphorus (P), arsenic (As), and/or antimony (Sb).

The substrate 110 may be textured to have a textured surface corresponding to an uneven surface or having uneven characteristics.

The emitter region 120 is an impurity doped region doped with impurities of a second conductive type (for example, n-type) opposite the first conductive type (for example, p-type) of the substrate 110. Thus, the emitter region 120 of the second conductive type forms a p-n junction along with the substrate 110 of the first conductive type.

Carriers, i.e., electron-hole pairs produced by light incident on the substrate 110 are separated into electrons and holes by a built-in potential difference resulting from the p-n junction between the substrate 110 and the emitter region 120. Then, the separated electrons move to the n-type semiconductor, and the separated holes move to the p-type semiconductor. Thus, when the substrate 110 is of the p-type and the emitter region 120 is of the n-type, the separated holes move to the substrate 110 and the separated electrons move to the emitter region 120. Hence, the holes become major carriers in the substrate 110, and the electrons become major carriers in the emitter region 120.

If the substrate 110 is of the n-type in another embodiment of the invention, the emitter region 120 may be of the p-type. In this instance, the separated electrons move to the substrate 110 and the separated holes move to the emitter region 120.

When the emitter region 120 is of the n-type, the emitter region 120 may be formed by doping the substrate 110 with impurities of a group V element such as phosphorus (P), arsenic (As), and/or antimony (Sb). Alternatively, when the emitter region 120 is of the p-type, the emitter region 120 may be formed by doping the substrate 110 with impurities of a group III element such as boron (B), gallium (Ga), and/or indium (In).

The anti-reflection layer 130 on the emitter region 120 may be formed of at least one of silicon nitride (SiNx), silicon oxide (SiOx), and silicon oxynitride (SiOxNy). The anti-reflection layer 130 reduces a reflectance of light incident on the solar cell 1 and increases selectivity of a predetermined wavelength band, thereby increasing the efficiency of the solar cell 1. The anti-reflection layer 130 may have a thickness of about 70 nm to 80 nm. The anti-reflection layer 130 may be omitted, if necessary or desired.

The passivation layer 190 includes a first passivation layer 191 positioned on the back surface of the substrate 110 and a second passivation layer 192 positioned on a back surface of the first passivation layer 191. Further, the passivation layer 190 has the plurality of via holes passing through the first and second passivation layers 191 and 192.

The first passivation layer 191 is formed of amorphous silicon (a-Si). The first passivation layer 191 has a thickness of about 50 nm to 100 nm and a refractive index of about 3.0 to 3.8.

The second passivation layer 192 is formed of amorphous silicon nitride (a-SiNx). The second passivation layer 192 has a thickness of about 10 nm to 50 nm and a refractive index of about 1.8 to 1.9.

Because the first passivation layer 191 is formed of amorphous silicon having the relatively high refractive index, light traveling from the first passivation layer 191 to the second passivation layer 192 is reflected to the substrate 110 due to an increase in a difference between the refractive indexes of the first and second passivation layers 191 and 192. Hence, an amount of light emitted from an interface between the first and second passivation layers 191 and 192 may decrease.

If a thin substrate 110 is used, an absorptance of the thin substrate 110 with respect to light of a long wavelength equal to or greater than about 1,000 nm may decrease. On the other hand, when the first and second passivation layers 191 and 192 each having the above-described thickness and refractive index are formed on the back surface of the substrate 110 as in the embodiment of the invention, a light reflectance in the back surface of the substrate 110 may increase even if the thin substrate 110 is used. Hence, an absorptance of the substrate 110 with respect to light of the long wavelength may increase, and the efficiency of the solar cell 1 may increase.

An amount of hydrogen (H) contained in the first passivation layer 191 formed of amorphous silicon may increase since the first passivation layer 191 is formed using a low temperature deposition method. Further, the first passivation layer 191 formed of amorphous silicon containing hydrogen (H) of a high concentration may prevent or reduce a crystal defect at the interface between the first and second passivation layers 191 and 192 and inside the first and second passivation layers 191 and 192. Thus, a recombination and/or a disappearance of carriers at and around the surface of the substrate 110 may be prevented or reduced.

In the embodiment of the invention, a ratio b/c of a refractive index 'b' of the first passivation layer 191 to a refractive index 'c' of the second passivation layer 192 may be about 1.57 to 2.11. When the ratio b/c is equal to or greater than about 1.57, a reflectance of light incident on the passivation layer 190 from the substrate 110 increases.

The plurality of front electrodes 151 are positioned on the emitter region 120 and are electrically connected to the emitter region 120. The plurality of front electrodes 151 extend substantially parallel to one another in a fixed direction at a distance therebetween. The plurality of front electrodes 151 collect carriers (for example, electrons) moving to the emitter region 120.

The plurality of front electrode current collectors 152 are positioned on the same level layer as the front electrodes 151 on the emitter region 120. The plurality of front electrode current collectors 152 extend in the direction crossing the front electrodes 151. The plurality of front electrode current collectors 152 collect carriers collected by the front electrodes 151 and output the carriers to an external device.

The front electrodes 151 and the front electrode current collectors 152 may be formed of at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used. The front electrodes 151 and the front electrode current collectors 152 may have a thickness of about 20 µm to 40 µm.

The back electrode 161 is positioned on the back surface of the passivation layer 190 and is electrically connected to the substrate 110 through the via holes of the passivation layer 190. The back electrode 161 collects carriers (for example, holes) moving to the substrate 110. The back electrode 161 may be formed by screen-printing a back electrode paste and may have a thickness of about 20 µm to 30 µm.

The back electrode 161 may be formed of at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The plurality of back electrode current collectors 162 are positioned on the back surface of the passivation layer 190 and extend in the same direction as the front electrode current collectors 152. The back electrode current collectors 162 may be positioned opposite the front electrode current collectors 152. In another embodiment of the invention, the back electrode current collector 162 may include a plurality of conductors having a circle shape or a polygon shape which are positioned at a constant distance therebetween. The back electrode current collectors 162 and the front electrode current collectors 152 may be aligned in embodiments of the invention.

The back electrode current collectors 162 collect carriers (for example, holes) transferred from the back electrode 161 and output the carriers to the external device.

The back electrode current collectors 162 may be formed of at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The plurality of BSF regions 170 are positioned between the portion of the substrate 110 exposed through the via holes of the passivation layer 190 and the back electrode 161. Each of the BSF regions 170 is a region (for example, an $n^+$-type region) that is more heavily doped than the substrate 110 with impurities of the same conductive type as the substrate 110.

The plurality of BSF regions 170 prevent or reduce a recombination and/or a disappearance of electrons and holes at and around the back surface of the substrate 110.

The solar cell 1 having the above-described structure comprises the passivation layer 190 including the first passivation layer 191 formed of amorphous silicon having the high refractive index and the second passivation layer 192 having the low refractive index on the back surface of the substrate 110, thereby increasing the light reflectance of the long wavelength band and increasing a reabsorption of light inside the substrate 110. Hence, a recombination and/or a disappearance of carriers resulting from unstable bonds existing at the surface of the substrate 110 may be prevented or reduced. An operation of the solar cell 1 according to the embodiment of the invention is described below.

When light irradiated onto the solar cell 1 is incident on the substrate 110 through the anti-reflection layer 130 and the emitter region 120, a plurality of electron-hole pairs are generated in the substrate 110 by light energy produced by the light incident on the substrate 110. In this instance, because a reflection loss of light incident on the substrate 110 is reduced by the anti-reflection layer 130, an amount of light incident on the substrate 110 increases.

The electron-hole pairs are separated into electrons and holes by the p-n junction between the substrate 110 and the emitter region 120, and the separated holes move to the p-type substrate 110 and the separated electrons move to the n-type emitter region 120. The electrons moving to the emitter region 120 are collected by the front electrodes 151 and then are collected by the front electrode current collectors 152. Further, the holes moving to the substrate 110 are transferred to the back electrode 161 and then are collected by the back electrode current collectors 162. When the front electrode current collectors 152 are connected to the back electrode current collectors 162 using electric wires, current flows therein to thereby enable use of the current for electric power.

Because the solar cell 1 according to the embodiment of the invention includes the passivation layer 190 having the interface with the large refractive index difference on the back surface of the substrate 110, the light reflectance in the back surface of the substrate 110 with respect to light of the long wavelength band passing through the substrate 110 is improved. Thus, the light absorptance of the substrate 110 increases, and characteristics of a short-circuit current are improved. As a result, the efficiency of the solar cell 1 is improved.

Further, in the solar cell 1 according to the embodiment of the invention, the passivation layer 190 is formed on the back surface of the substrate 110, and the back electrode 161 passes through the passivation layer 190 and is locally connected to the substrate 110 through the BSF regions 170. Therefore, a recombination and/or a disappearance of carriers at and around the surface of the substrate 110 are prevented or reduced. As a result, the efficiency of the solar cell 1 is improved.

Next, a solar cell according to another example embodiment of the invention is described with reference to FIGS. 3 and 4.

Figure 3:
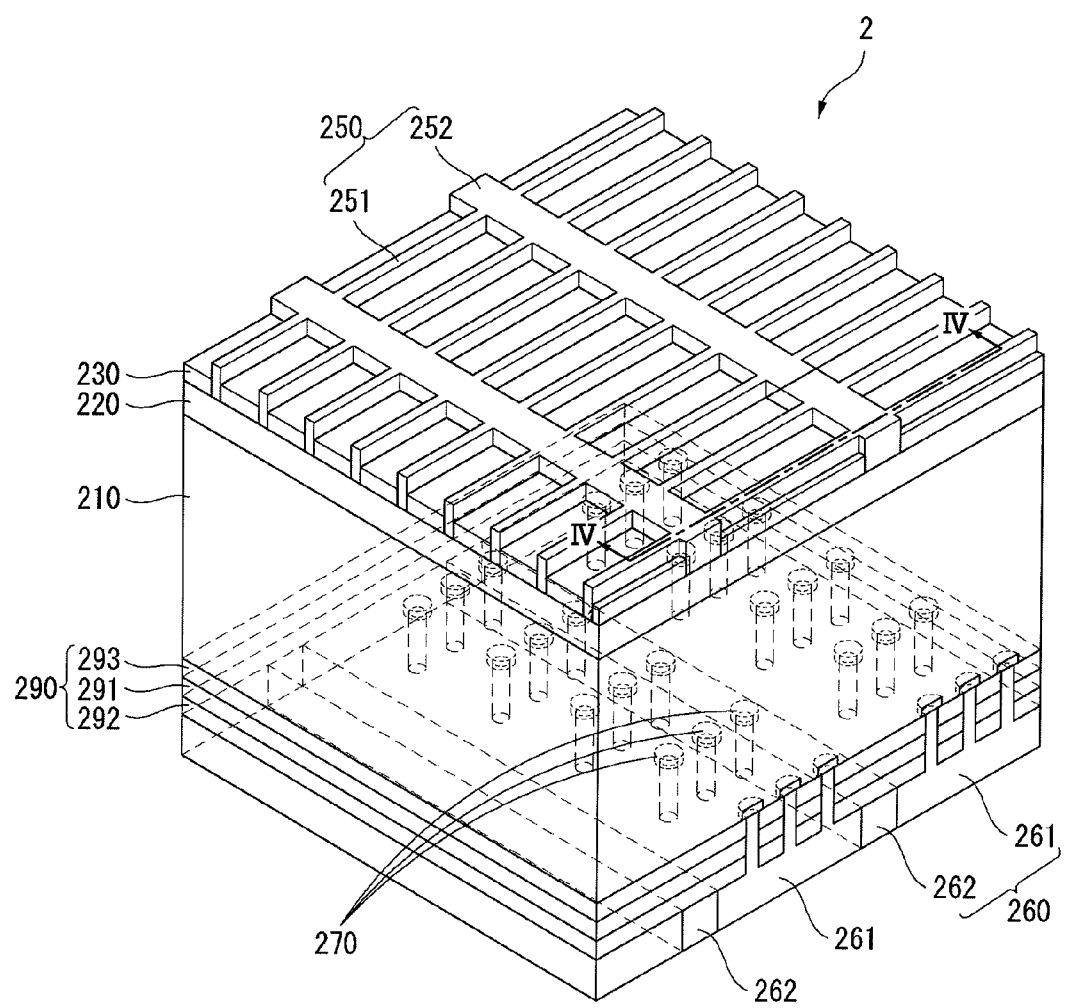
FIG. 3 is a partial perspective view of a solar cell according to another example embodiment of the invention.
Figure 4:
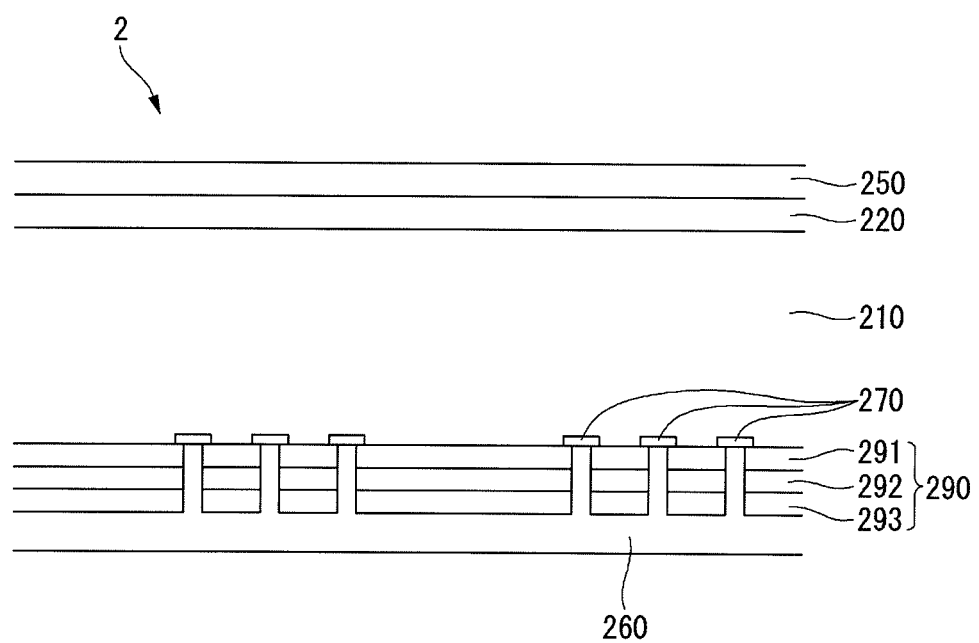
FIG. 4 is a cross-sectional view taken along line IV-IV of FIG. 3.

FIG. 3 is a partial perspective view of a solar cell according to another example embodiment of the invention, and FIG. 4 is a cross-sectional view taken along line II-II of FIG. 3.

Structures and components identical or equivalent to those illustrated in FIGS. 1 and 2 are designated with the same reference numerals in FIGS. 3 and 4, and a further description may be briefly made or may be entirely omitted.

As shown in FIG. 3, a solar cell 2 according to an embodiment of the invention includes a passivation layer 290 including a third passivation layer 293 on a back surface of a substrate 210, a first passivation layer 291 on a back surface of the third passivation layer 293, and a second passivation layer 292 on a back surface of the first passivation layer 291, unlike the solar cell 1 shown in FIGS. 1 and 2.

In the passivation layer 290, a refractive index of the first passivation layer 291 is more than a refractive index of the second passivation layer 292 and the third passivation layer 293, respectively.

In more detail, the first passivation layer 291 is formed of amorphous silicon (a-Si). The first passivation layer 291 has a thickness of about 50 nm to 100 nm and a refractive index of about 3.0 to 3.8.

The second passivation layer 292 is formed of amorphous silicon nitride (a-SiNx). The second passivation layer 292 has a thickness of about 10 nm to 50 nm and a refractive index of about 1.8 to 1.9.

The third passivation layer 293 is formed of silicon oxide (SiOx). The third passivation layer 293 has a thickness of about 50 nm to 200 nm and a refractive index of about 1.3 to 1.7.

In other words, the passivation layer 290 shown in FIG. 3 further includes the third passivation layer 293 formed of silicon oxide between the substrate 210 and the first passivation layer 291 formed of amorphous silicon, unlike the passivation layer 190 shown in FIG. 1.

Because the passivation layer 290 further includes the third passivation layer 293 having the relatively low refractive index, light traveling from the substrate 210 to the third passivation layer 293 is reflected to the substrate 210 due to an increase in a difference between the refractive indexes of the substrate 210 and the third passivation layer 293. Hence, an amount of light emitted from an interface between the substrate 210 and the third passivation layer 293 may decrease.

Because the first passivation layer 291 is formed of amorphous silicon having the relatively high refractive index, light traveling from the first passivation layer 291 to the second passivation layer 292 is reflected to the substrate 210 due to an increase in a difference between the refractive indexes of the first and second passivation layers 291 and 292. Hence, an amount of light emitted from an interface between the first and second passivation layers 291 and 292 may decrease. Further, an amount of light emitted from an interface between the first and third passivation layers 291 and 293 may decrease due to an increase in a difference between the refractive indexes of the first and third passivation layers 291 and 293.

If the thin substrate 210 is used, an absorptance of the thin substrate 210 with respect to light of a long wavelength equal to or greater than about 1,000 nm may decrease. On the other hand, when the passivation layer 290 including the first to third passivation layers 291 to 293 each having the above-described thickness and refractive index are formed on the back surface of the substrate 210 as in the embodiment of the invention, a light reflectance in the back surface of the substrate 210 may increase even if the thin substrate 210 is used. Hence, an absorptance of light of the long wavelength may increase, and the efficiency of the solar cell 2 may increase.

The third passivation layer 293 formed of silicon oxide (SiOx) converts unstable bonds, for example, dangling bonds existing at and around the surface of the substrate 210 into stable bonds, thereby preventing or reducing a recombination and/or a disappearance of carriers (for example, holes) moving to the substrate 210.

In the embodiment of the invention, a ratio b/a of a refractive index 'b' of the first passivation layer 291 to a refractive index 'a' of the third passivation layer 293 may be about 2 to 3. Further, a ratio b/c of the refractive index 'b' of the first passivation layer 291 to a refractive index 'c' of the second passivation layer 292 may be about 1.57 to 2.11.

When the ratio b/a and the ratio b/c are equal to or greater than about 1.57, a reflectance of light incident on the passivation layer 290 from the substrate 210 increases. Hence, a light absorptance of the solar cell 2 increases.

An example method for manufacturing the solar cell 1 shown in FIG. 1 is described below with reference to FIG. 5.

Figure 5:
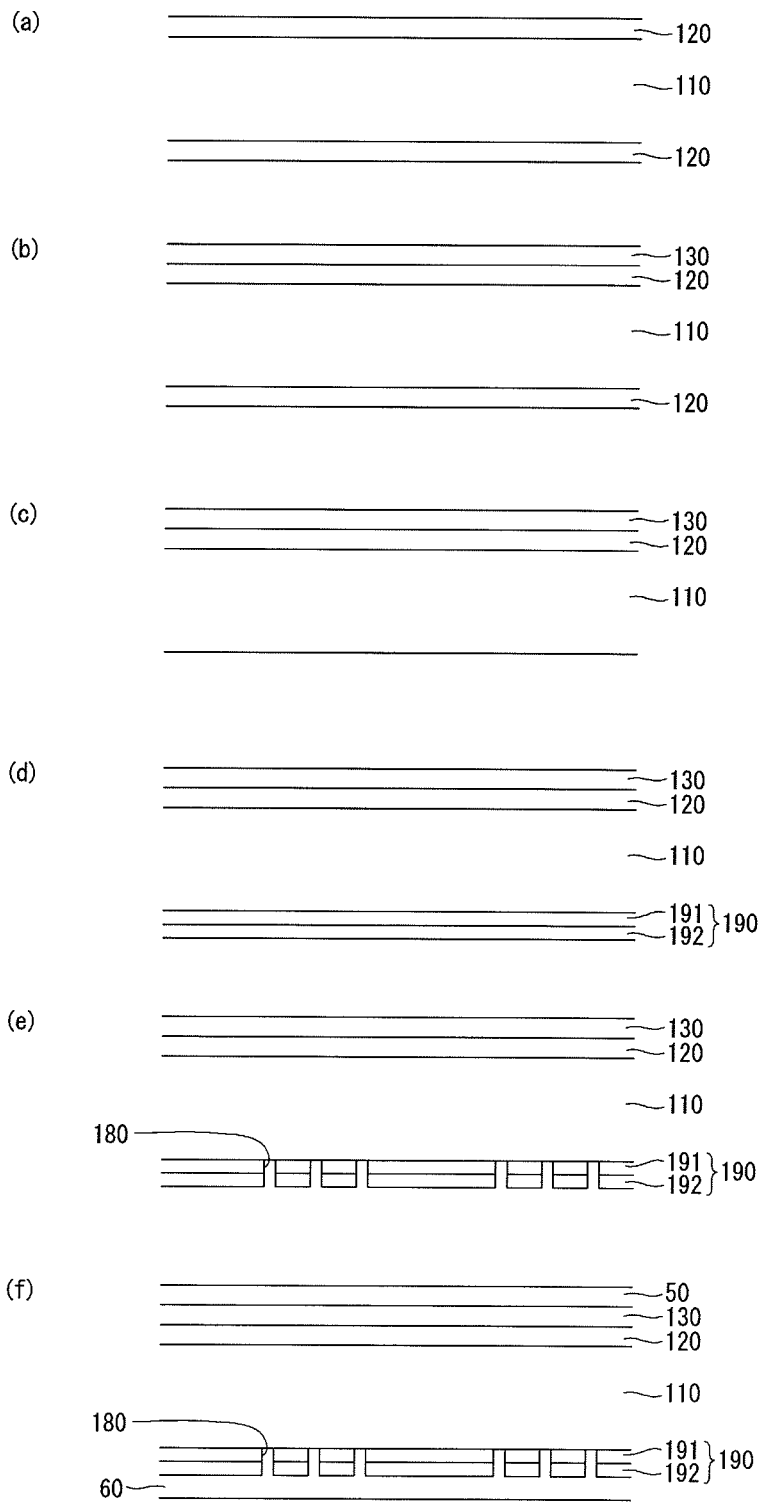
FIG. 5 is a cross-sectional view sequentially illustrating a method for manufacturing the solar cell shown in FIG. 1 according an example embodiment of the invention.

FIG. 5 is a cross-sectional view sequentially illustrating a method for manufacturing the solar cell shown in FIG. 1.

First, as shown in (a) of FIG. 5, a high temperature thermal process of a material (for example, POCl$_3$ or H$_3$PO$_4$) containing impurities of a group V element such as P, As, and/or Sb is performed on the substrate 110 formed of p-type single crystal silicon or p-type polycrystalline silicon to diffuse the impurities of the group V element into the substrate 110. Hence, the n-type emitter region 120 is formed at the entire surface of the substrate 110 including a front surface, a back surface, and lateral surfaces of the substrate 110. If the substrate 110 is of an n-type in another embodiment of the invention, a high temperature thermal process of a material (for example, $B_2H_6$) containing impurities of a group III element may be performed on the n-type substrate 110 or the material containing the impurities of the group III element may be stacked on the n-type substrate 110 to form the p-type emitter region 120 at the entire surface of the substrate 110. Subsequently, phosphorous silicate glass (PSG) containing phosphor (P) or boron silicate glass (BSG) containing boron (B) produced when p-type impurities or n-type impurities are diffused into the substrate 110 is removed through an etching process.

If necessary, before the emitter region 120 is formed, a texturing process may be performed on the entire surface of the substrate 110 to form a textured surface corresponding to an uneven surface or having uneven characteristics.

Next, as shown in (b) of FIG. 5, the anti-reflection layer 130 is formed on the front surface of the substrate 110 using a chemical vapor deposition (CVD) method such as a plasma enhanced chemical vapor deposition (PECVD) method.

Next, as shown in (c) of FIG. 5, a wet etching or a dry etching is performed to remove the back surface of the substrate 110 by a predetermined thickness. Hence, the emitter region 120 formed at the back surface of the substrate 110 is removed.

Alternatively, the impurities may be diffused only into the front surface of the substrate 110 to form the emitter region 120 only at a desired portion of the substrate 110. Hence, a step for removing the emitter region 120 formed at the back surface of the substrate 110 may be omitted.

Next, as shown in (d) of FIG. 5, an amorphous silicon (a-Si) layer is stacked on the back surface of the substrate 110 using the PECVD method to form the first passivation layer 191. The first passivation layer 191 thus formed has a thickness of about 50 nm to 100 nm and a refractive index 'b' of about 3.0 to 3.8.

Subsequently, an amorphous silicon nitride (a-SiNx) layer is stacked on the first passivation layer 191 using the PECVD method to form the second passivation layer 192. The second passivation layer 192 thus formed has a thickness of about 10 nm to 50 nm and a refractive index of about 1.8 to 1.9.

Because the step for forming the first passivation layer 191 and the step for forming the second passivation layer 192 are performed using the PECVD method, the same equipment may be used. Thus, the passivation layer 190 including the first and second passivation layers 191 and 192 may be manufactured through a simple manufacturing process, and manufacturing time may be reduced.

Next, as shown in (e) of FIG. 5, a laser beam is irradiated onto a predetermined portion of the passivation layer 190 to form a plurality of via holes 180 which pass through the passivation layer 190 and expose a portion of the substrate 110. The plurality of via holes 180 may have a circle shape, an oval shape, or a polygon shape.

The plurality of via holes 180 may be formed on the same line along a first direction (for example, a longitudinal direction of the current collectors) at a constant distance therebetween. In this instance, the plurality of via holes 180 may be formed on the same line along a second direction perpendicular to the first direction at a constant distance therebetween. Alternatively, the plurality of via holes 180 may be formed along the second direction in a zigzag form. The embodiment of the invention is not limited thereto. The plurality of via holes 180 having various patterns may be formed in consideration of the connection structure between the substrate 110 and the back electrode formed in a subsequent process.

Next, as shown in (f) of FIG. 5, a pattern 60 comprising a back electrode pattern and a back electrode current collector pattern are formed using a screen printing method.

The back electrode pattern may be formed by coating a back electrode paste on a corresponding portion of the passivation layer 190 and the exposed portion of the substrate 110 and then drying the back electrode paste. The back electrode paste may contain at least one selected from the group consisting of nickel (Ni), copper (Cu), silver (Ag), aluminum (Al), tin (Sn), zinc (Zn), indium (In), titanium (Ti), gold (Au), and a combination thereof.

The back electrode current collector pattern may be formed by coating a paste containing silver (Ag) on a corresponding portion of the back surface of the passivation layer 190 and then drying the paste. The plurality of back electrode current collector patterns are separated from one another by the back electrode pattern and extend in one direction. The embodiment of the invention is not limited thereto.

Next, a paste containing silver (Ag) is coated on a corresponding portion of the front surface of the anti-reflection layer 130 using the screen printing method and then is dried to form a front electrode and front electrode current collector pattern 50. The front electrode and front electrode current collector pattern 50 includes a front electrode pattern and a front electrode current collector pattern which extend in a crossing direction between them.

In other words, the front electrode pattern and the front electrode current collector pattern extend in different directions at each crossing between them. In the embodiment of the invention, a width of the front electrode current collector pattern is greater than a width of the front electrode pattern. The embodiment of the invention is not limited thereto.

In another embodiment of the invention, after the front electrode and front electrode current collector pattern 50 is formed, the pattern 60 comprising the back electrode pattern and the back electrode current collector pattern may be formed.

Next, the substrate 110, on which the pattern 60 comprising the back electrode pattern and the back electrode current collector pattern, and the front electrode and front electrode current collector pattern 50 are formed, is fired at a temperature of about 750° C. to 800° C. to form the plurality of front electrodes 151, the plurality of front electrode current collectors 152, the back electrode 161, the plurality of back electrode current collectors 162, and the plurality of BSF regions 170. Hence, the solar cell 1 shown in FIGS. 1 and 2 is completed.

In other words, when a thermal process is performed, a portion of the anti-reflection layer 130 contacting the front electrode and front electrode current collector pattern 50 is removed by an etching component, for example, lead (Pb) contained in the front electrode and front electrode current collector pattern 50. Hence, the plurality of front electrodes 151 and the plurality of front electrode current collectors 152 contacting the emitter region 120 are formed. Further, the back electrode pattern and the back electrode current collector pattern form the back electrode 161 and the plurality of back electrode current collectors 162, respectively.

The plurality of BSF regions 170 are formed in a portion of the substrate 110 contacting the back electrode pattern.

Because the passivation layer 190 including the first and second passivation layers 191 and 192 each having the above-described thickness and refractive index is formed on the back surface of the substrate 110 in the embodiment of the invention, the light reflectance in the back surface of the substrate 110 with respect to light of the long wavelength band passing through the substrate 110 is improved. Hence, the solar cell 1 having the improved reincidence of light may be manufactured.

Further, in the embodiment of the invention, the passivation layer 190 is formed on the back surface of the substrate 110, and the back electrode 161 passes through the passivation layer 190 and is locally connected to the substrate 110 through the BSF regions 170. Therefore, the solar cell 1, in which the recombination and/or the disappearance of carriers at and around the surface of the substrate 110 are prevented or reduced, may be manufactured.

An example method for manufacturing the solar cell 2 shown in FIG. 3 is described below with reference to FIG. 6.

Figure 6:
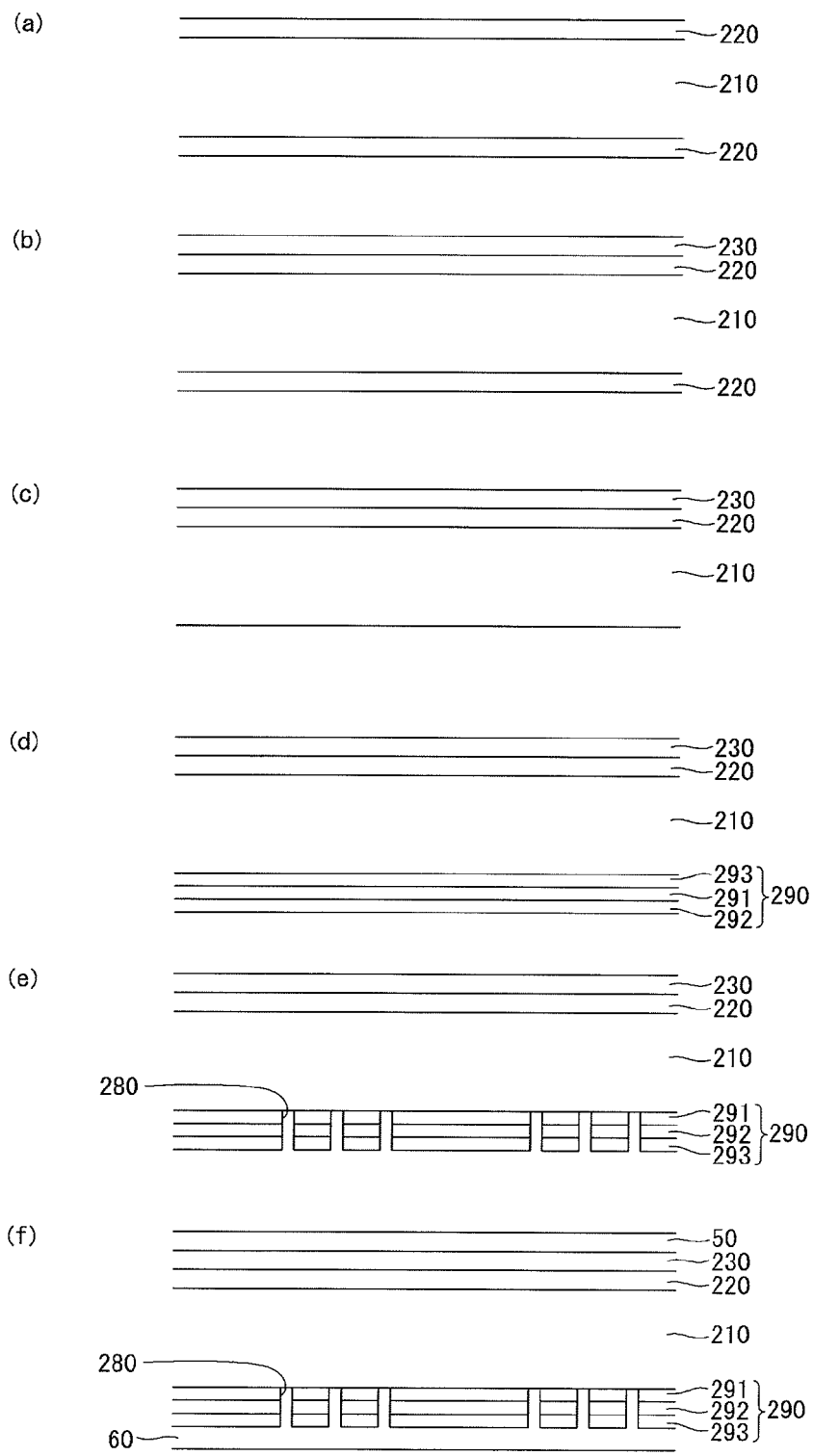
FIG. 6 is a cross-sectional view sequentially illustrating a method for manufacturing the solar cell shown in FIG. 3 according an example embodiment of the invention.

FIG. 6 is a cross-sectional view sequentially illustrating a method for manufacturing the solar cell shown in FIG. 3.

In the following description, any description having the same process as FIG. 5 may be briefly made or may be entirely omitted.

The method for manufacturing the solar cell 2 illustrated in FIG. 6 further includes an operation for forming the third passivation layer 293 formed of silicon oxide (SiOx) before forming the first passivation layer 291, unlike the method for manufacturing the solar cell 1 illustrated in FIG. 5.

In other words, as shown in (d) of FIG. 6, a silicon oxide (SiOx) layer is stacked on the back surface of the substrate 210 using the PECVD method to form the third passivation layer 293. The third passivation layer 293 thus formed has a thickness of about 50 nm to 200 nm and a refractive index 'a' of about 1.3 to 1.7.

Next, an amorphous silicon (a-Si) layer is stacked on the third passivation layer 293 using the PECVD method to form the first passivation layer 291. The first passivation layer 291 thus formed has a thickness of about 50 nm to 100 nm and a refractive index 'b' of about 3.0 to 3.8.

Next, an amorphous silicon nitride (a-SiNx) layer is stacked on the first passivation layer 291 using the PECVD method to form the second passivation layer 292. The second passivation layer 292 thus formed has a thickness of about 10 nm to 50 nm and a refractive index of about 1.8 to 1.9.

Because the steps for forming the first, second, and third passivation layers 291, 292, and 293 are performed using the PECVD method, the same equipment may be used. Thus, the passivation layer 290 including the first, second, and third passivation layers 291, 292, and 293 may be manufactured through a simple manufacturing process, and manufacturing time may be reduced.

When the passivation layer 290 including the silicon oxide (SiOx) layer, the amorphous silicon (a-Si) layer, and the amorphous silicon nitride (a-SiNx) layer each having the above-described thickness and refractive index is formed on the back surface of the substrate 210, a back side reflectance of light and characteristics of a short-circuit current Jsc with respect to the passivation layer 290 according to the embodiment of the invention are described below with reference to FIGS. 7 to 9.

Figure 7:
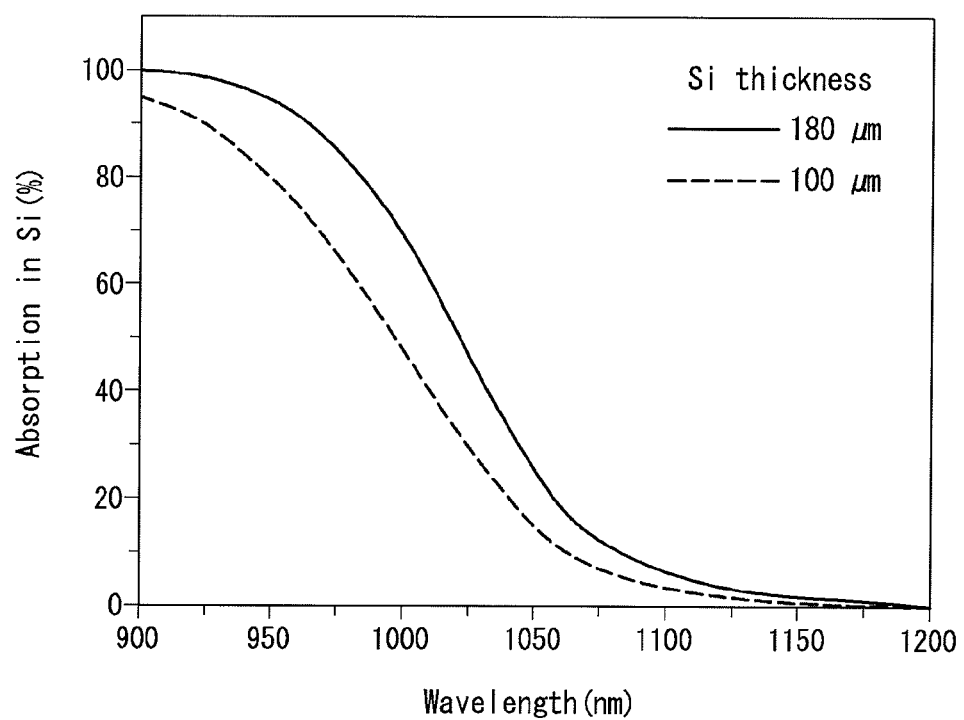
FIG. 7 is a graph indicating an absorptance of light depending on a wavelength of light when a thickness of a substrate is about 100 μm and 180 μm.

FIG. 7 is a graph indicating an absorptance of light depending on a wavelength of light when a thickness of the substrate is about 100 μm and 180 μm. FIG. 8 is a graph indicating a back side reflectance of light depending on a wavelength of light when a passivation layer according to a comparative example and the passivation layer 290 according to the embodiment of the invention are used. FIG. 9 is a graph indicating characteristics of a short-circuit current Jsc depending on a wavelength of light when a passivation layer according to a comparative example and the passivation layer 290 according to the embodiment of the invention are used.

Figure 8:
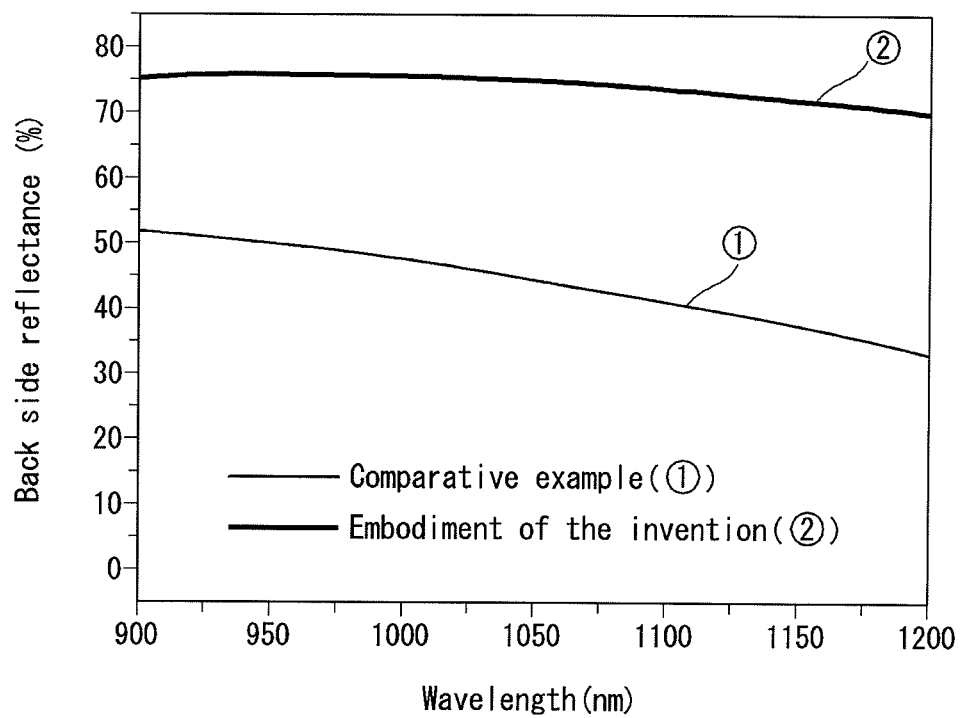
FIG. 8 is a graph indicating a back side reflectance of light depending on a wavelength of light when a passivation layer according to a comparative example and a passivation layer according to an embodiment of the invention are formed.
Figure 9:
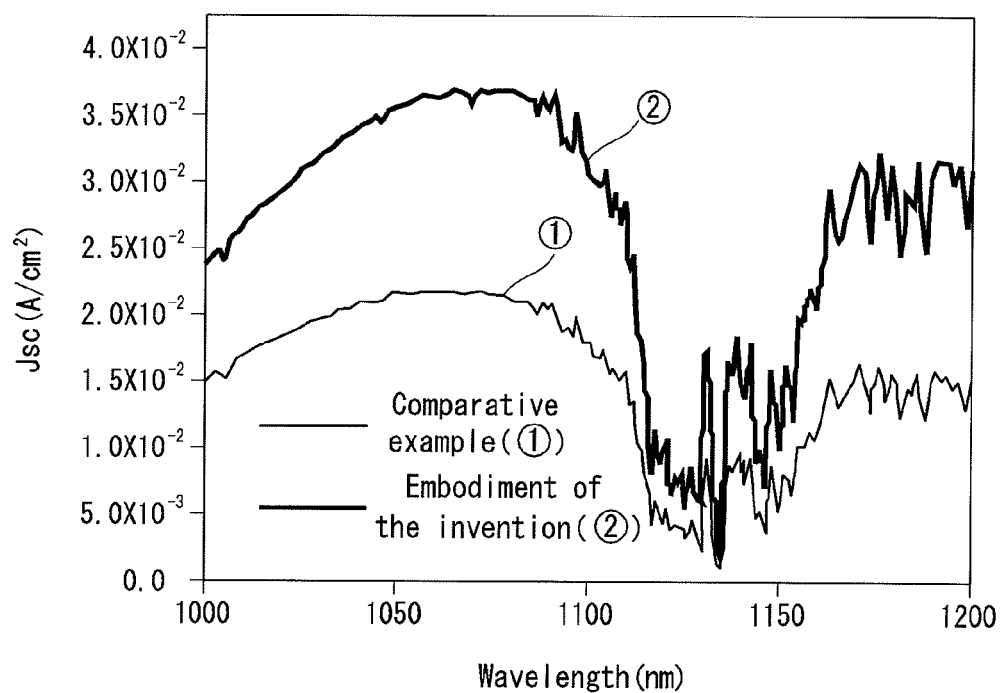
FIG. 9 is a graph indicating characteristics of a short-circuit current depending on a wavelength of light when a passivation layer according to a comparative example and a passivation layer according to an embodiment of the invention are formed.

In FIGS. 8 and 9, a first graph ① according to the comparative example indicates a light reflectance and characteristics of a short-circuit current Jsc depending on a wavelength of light with respect to a passivation layer including a silicon oxide (SiOx) layer, which has a refractive index of about 1.5 and a thickness of about 10 nm to 200 nm and is formed on a back surface of a substrate, a silicon nitride (SiNx) layer, which has a refractive index of about 2.3 and a thickness of about 50 nm to 100 nm and is formed on a back surface of the silicon oxide (SiOx) layer, and a silicon oxynitride (SiONx) layer which has a refractive index of about 1.7 and a thickness of about 100 nm to 200 nm and is formed on a back surface of the silicon nitride (SiNx).

Further, in FIGS. 8 and 9, a second graph ② according to the embodiment of the invention indicates a light reflectance and characteristics of a short-circuit current Jsc depending on a wavelength of light with respect to the passivation layer 290 including the third passivation layer 293 (i.e., the silicon oxide (SiOx) layer), which has a refractive index of about 1.5 and a thickness of about 50 nm to 200 nm and is formed on the back surface of the substrate, the first passivation layer 291 (i.e., the amorphous silicon (a-Si) layer), which has a refractive index of about 3.7 and a thickness of about 50 nm to 100 nm and is formed on the back surface of the third passivation layer 293, and the second passivation layer 292 (i.e., the amorphous silicon nitride (a-SiNx) layer) which has a refractive index of about 1.8 and a thickness of about 10 nm to 50 nm and is formed on the back surface of the first passivation layer 291.

As shown in FIG. 8, in the first graph ① according to the comparative example, an average reflectance at a wavelength of about 1,000 nm to 1,200 nm was about 42%. On the other hand, in the second graph ② according to the embodiment of the invention, an average reflectance at the wavelength of about 1,000 nm to 1,200 nm was about 74%. In particular, an average reflectance in the first graph ① was about 37% and an average reflectance in the second graph ② was about 73% at a wavelength of about 1,100 nm to 1,200 nm.

As described above, when the passivation layer 290 according to the embodiment of the invention was formed, the reflectance at the wavelength of about 1,000 nm to 1,200 nm increased by about 32% as compared to the comparative example. In particular, the reflectance at the wavelength of about 1,100 nm to 1,200 nm increased by about 36% as compared to the comparative example. In other words, the reflectance in the back surface of the substrate with respect to light of the long wavelength band greatly increased as compared to the comparative example.

As shown in FIG. 9, in the first graph ① according to the comparative example, the short-circuit current Jsc at the wavelength of about 1,000 nm to 1,200 nm was about 3.10 mA/cm². On the other hand, in the second graph according to the embodiment of the invention, the short-circuit current Jsc at the wavelength of about 1,000 nm to 1,200 nm was about 5.45 mA/cm². In particular, the short-circuit current Jsc in the first graph ① was about 1.11 mA/cm² and the short-circuit current Jsc in the second graph ② was about 2.14 mA/cm² at the wavelength of about 1,100 nm to 1,200 nm.

As described above, when the passivation layer 290 according to the embodiment of the invention was formed, the short-circuit current Jsc at the wavelength of about 1,000 nm to 1,200 nm increased by about 75.8% as compared to the comparative example. In particular, the short-circuit current Jsc at the wavelength of about 1,100 nm to 1,200 nm increased by about 92.8% as compared to the comparative example. In other words, the short-circuit current Jsc at the long wavelength band greatly increased as compared to the comparative example.

As described above, when the passivation layer 290 according to the embodiment of the invention is used, the light reflectance in the back surface of the substrate with respect to light of the long wavelength band increases. Hence, the light absorptance of the substrate increases, and the characteristics of the short-circuit current Jsc are improved.

As shown in FIG. 7, when the thickness of the substrate 110 (or 210) decreased (for example, from about 180 μm to 100 μm), an absorptance of light of a long wavelength band equal to or greater than about 900 nm was reduced. In particular, when the thickness of the substrate 110 (or 210) decreased to about 100 μm, an absorptance of light of a long wavelength band equal to or greater than about 1,000 nm was less than about 50%.

However, when the passivation layer 190 (or 290) according to the embodiment of the invention is formed, the light reflectance in the back surface of the substrate 110 (or 210) with respect to light of the long wavelength band increases even if the thin substrate is used. Hence, the light absorptance of the substrate 110 (or 210) increases, and the characteristics of the short-circuit current Jsc are improved.

Considering above, in the embodiment of the invention, the thickness of the semiconductor substrate 110 may be about 60 μm to 140 μm.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a substrate of a first conductive type;
an emitter region of a second conductive type opposite the first conductive type positioned on a front surface of the substrate, the emitter region forming a p-n junction along with the substrate;
an anti-reflection layer positioned on the emitter region;
a first electrode connected to the emitter region through the anti-reflection layer, the first electrode including a plurality of front electrodes positioned directly on the emitter region on the front surface of the substrate and at least one front electrode current collector positioned directly on the emitter region on the front surface of the substrate and extending in a direction crossing the plurality of front electrodes configured to connect the plurality of front electrodes;
a back passivation layer positioned on a back surface of the substrate, the back passivation layer having a plurality of via holes exposing a portion of the back surface of the substrate; and
a second electrode which is positioned on a back surface of the back passivation layer and is connected to the substrate through the plurality of via holes,
wherein the back passivation layer includes a silicon oxide layer positioned on the back surface of the substrate, the silicon oxide layer having a thickness of 50 nm to 200 nm and a refractive index of 1.3 to 1.7,
an amorphous silicon layer positioned on the silicon oxide layer, the amorphous silicon layer having a thickness of 50 nm to 100 nm and a refractive index of 3.0 to 3.8, and
an amorphous silicon nitride layer positioned directly on the amorphous silicon layer, the amorphous silicon nitride layer having a thickness of 10 nm to 50 nm and a refractive index of 1.8 to 1.9 configured to enhance an absorptance of the substrate with respect to light of a long wavelength equal to or greater than 1,000 nm.

2. The solar cell of claim 1, wherein a ratio of the refractive index of the amorphous silicon layer to the refractive index of the amorphous silicon nitride layer is about 1.57 to 2.11.

3. The solar cell of claim 1, wherein a thickness of the substrate is about 60 μm to 140 μm.

4. The solar cell of claim 1, further comprising a back surface field region positioned at portions of the substrate contacting the second electrode.

5. A method for manufacturing a solar cell comprising:
forming an emitter region of a second conductive type opposite a first conductive type on a front surface of a substrate of the first conductive type;
forming an anti-reflection layer on the emitter region;
forming a first electrode connected to the emitter region through the anti-reflection layer, the first electrode including a plurality of front electrodes positioned directly on the emitter region on the front surface of the substrate and at least one front electrode current collector positioned directly on the emitter region on the front surface of the substrate and extending in a direction crossing the plurality of front electrodes configured to connect the plurality of front electrodes;
forming a back passivation layer of a multi-layered structure having a plurality of via holes on a back surface of the substrate; and
forming a second electrode connected to the substrate through the plurality of via holes of the back passivation layer,
wherein the forming of the back passivation layer includes:
forming a silicon oxide layer on the back surface of the substrate, the silicon oxide layer having a thickness of 50 nm to 200 nm and a refractive index of 1.3 to 1.7,
forming an amorphous silicon layer on the silicon oxide layer, the amorphous silicon layer having a thickness of 50 nm to 100 nm and a refractive index of 3.0 to 3.8, and
forming an amorphous silicon nitride layer directly on the amorphous silicon layer, the amorphous silicon nitride layer having a thickness of 10 nm to 50 nm and a refractive index of 1.8 to 1.9 configured to enhance an absorptance of the substrate with respect to light of a long wavelength equal to or greater than 1,000 nm.

6. The method of claim 5, wherein a ratio of the refractive index of the amorphous silicon layer to the refractive index of the amorphous silicon nitride layer is about 1.57 to 2.11.

7. The solar cell of claim 1, wherein the plurality of via holes of the passivation layer are aligned in a direction parallel to a direction of the first electrode.

8. The method of claim 5, wherein the plurality of via holes of the passivation layer are aligned in a direction parallel to a direction of the first electrode.

9. The solar cell of claim 1, wherein the first electrode includes silver (Ag).

10. The solar cell of claim 1, wherein the second electrode includes at least one of nickel (Ni), copper (Cu), silver (Ag), aluminum (Al), tin (Sn), zinc (Zn), indium (In), titanium (Ti) and gold (Au).

11. The solar cell of claim 1, wherein the solar cell further comprises a back electrode current collector electrically connected to the second electrode.

12. The solar cell of claim 11, wherein the front electrode current collector and the back electrode current collector include silver (Ag).

13. The solar cell of claim 11, wherein the back electrode current collector is positioned on the back passivation layer.

14. The method of claim 5, wherein the plurality of via holes of the back passivation layer is formed by a laser.

15. The method of claim 5, further comprising forming a back surface field region positioned between portions of the substrate exposed through the plurality of via holes of the back passivation layer and the second electrode.

16. The method of claim 15, wherein the first electrode is formed by printing and thermal treatment of a paste containing silver (Ag).

17. The method of claim 16, wherein the second electrode is formed by printing and thermal treatment of a paste containing at least one of nickel (Ni), copper (Cu), silver (Ag), aluminum (Al), tin (Sn), zinc (Zn), indium (In), titanium (Ti) and gold (Au).

18. The method of claim 17, wherein the back surface field region is formed by the thermal treatment to form the second electrode.

19. The method of claim 17, wherein the first and second electrodes are simultaneously thermal-treated.

\* \* \* \* \*